United States Patent
Yoshida

(10) Patent No.: US 10,670,652 B2
(45) Date of Patent: Jun. 2, 2020

(54) SEMICONDUCTOR TEST EQUIPMENT

(71) Applicant: FUJI ELECTRIC CO., LTD., Kawasaki-shi, Kanagawa (JP)

(72) Inventor: Mitsuru Yoshida, Shiojiri (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 92 days.

(21) Appl. No.: 16/023,674

(22) Filed: Jun. 29, 2018

(65) Prior Publication Data
US 2019/0064251 A1 Feb. 28, 2019

(30) Foreign Application Priority Data

Aug. 31, 2017 (JP) .................................. 2017-166864

(51) Int. Cl.
*G01R 31/28* (2006.01)
*G01R 1/36* (2006.01)

(52) U.S. Cl.
CPC ..... *G01R 31/2879* (2013.01); *G01R 31/2875* (2013.01); *G01R 31/2889* (2013.01); *G01R 1/36* (2013.01)

(58) Field of Classification Search
CPC ............ G01R 31/2879; G01R 31/2875; G01R 31/2889; G01R 1/36
USPC .................. 324/754.07, 754.03, 754.01, 537
See application file for complete search history.

(56) References Cited

U.S. PATENT DOCUMENTS

| 3,824,430 | A | * | 7/1974 | Hentschel | H02H 3/13 361/23 |
| 5,430,292 | A | * | 7/1995 | Honjo | G03F 1/86 250/310 |
| 6,532,139 | B2 | * | 3/2003 | Kim | H02H 1/0015 361/42 |
| 6,888,708 | B2 | * | 5/2005 | Brungs | H02H 9/08 361/42 |
| 9,525,282 | B2 | * | 12/2016 | Armstrong | G01R 31/3272 |
| 2005/0003635 | A1 | * | 1/2005 | Takekoshi | B28D 5/0082 438/464 |
| 2006/0076503 | A1 | * | 4/2006 | Tsao | H01J 37/228 250/396 R |

(Continued)

FOREIGN PATENT DOCUMENTS

| JP | 2008-267818 A | 11/2008 |
| JP | 2017-41495 A | 2/2017 |

*Primary Examiner* — Giovanni Astacio-Oquendo
(74) *Attorney, Agent, or Firm* — Manabu Kanesaka

(57) ABSTRACT

A semiconductor test equipment can conduct a burn-in test, and has a testing table capable of aligning a plurality of contact units formed of a probe card having a plurality of contact probes each corresponding to each of a plurality of semiconductor chips formed on a semiconductor wafer to contact with the semiconductor wafer, and a holding tool for holding the semiconductor wafer and the probe card in a contacted state; a voltage application circuit having connection wiring lines provided in a manner capable of parallel connection of the plurality of contact units aligned on the testing table, and a plurality of connection units to apply a testing voltage to the semiconductor wafer held on each of the plurality of contact units; and a characteristic measuring circuit for measuring characteristics of the plurality of semiconductor chips formed on the semiconductor wafer according to application of the testing voltage.

8 Claims, 7 Drawing Sheets

(56) References Cited

U.S. PATENT DOCUMENTS

2006/0273263 A1\* 12/2006 Raymond .......... G01B 11/0616
                                                                250/492.2

\* cited by examiner

SEMICONDUCTOR TEST EQUIPMENT

RELATED APPLICATION

The present application is based on, and claims priority from, Japanese Patent Application No. JP 2017-166864 filed Aug. 31, 2017, the disclosure of which is hereby incorporated by reference herein in its entirety.

TECHNICAL FIELD

The present invention relates to a semiconductor test equipment for conducting a burn-in test on a semiconductor chip in a semiconductor wafer.

BACKGROUND ART

A burn-in test means a method for preliminarily reducing initial imperfection by applying a load of a temperature and a voltage to a semiconductor device, and is one of the most effective tests in detecting the initial imperfection among screening tests. A semiconductor wafer is ordinarily loaded from an automatic prober device, and a contact probe is contacted with a gate pad and an emitter pad of all chips by a probe card to conduct the test under an environment of applying a voltage at high temperature. However, a voltage application time for screening the semiconductor wafer reaches a level as much as several hours to several tens of hours, and therefore it has been recognized as a problem to require a great deal of time in testing a plurality of semiconductor wafers.

As a measure for shortening the time in the burn-in test, the burn-in test by applying the voltage and a characteristic inspection test are simultaneously conducted (for example, Japanese Patent Application Laid-Open No. 2017-041495). Moreover, the burn-in test is conducted by arranging a plurality of wafers in conducting a test at high temperature (for example, Japanese Patent Application Laid-Open No. 2008-267818).

SUMMARY OF INVENTION

Problems to be Solved by the Invention

In a conventional semiconductor wafer burn-in test equipment, semiconductor wafers are passed through a testing process one by one by an automatic prober device, and therefore a testing time also depends on the number of the semiconductor wafers to be tested, in which a problem of elongation of the testing time has remained.

Moreover, in order to conduct a burn-in test on a plurality of semiconductor wafers under an environment of applying a voltage at high temperature as in the conventional technology described above, it is necessary to establish a complicated test equipment by introducing a plurality sets of automatic prober devices to simultaneously contact with the plurality of semiconductor wafers or the like, in which a problem of requiring a large amount of facility investment has remained.

The present invention has been made in view of the problems described above, and an object of the present invention is to provide a semiconductor test equipment capable of simultaneously conducting a burn-in test on a plurality of semiconductor wafers.

Means to Solve the Problems

A semiconductor test equipment according to the present invention has features of having a testing table capable of aligning a plurality of contact units each formed of a probe card having a plurality of contact probes each corresponding to each of a plurality of semiconductor chips formed on a semiconductor wafer to contact with the semiconductor wafer, and a holding tool for holding the semiconductor wafer and the probe card in a contacted state; a voltage application circuit having a connection wiring line and a plurality of connection units provided in a manner capable of parallel connection of the plurality of contact units aligned on the testing table so as to apply a testing voltage to the semiconductor wafer held to each of the plurality of contact units; and a characteristic measuring circuit for measuring characteristics of the plurality of semiconductor chips formed on the semiconductor wafer according to application of the testing voltage.

Advantageous Effects of Invention

According to a semiconductor test equipment of the present invention, a testing time in a burn-in test can be shortened by connecting a plurality of semiconductor wafers contacted and checked with a probe card, and simultaneously applying a voltage to the plurality of semiconductor wafers. Moreover, a general-purpose and scalable test equipment configuration can be taken by utilizing an automatic probing technology on the semiconductor wafer and forming the testing circuit into a simplified configuration using a power supply and a relay.

DESCRIPTION OF EMBODIMENTS

Figure 1:
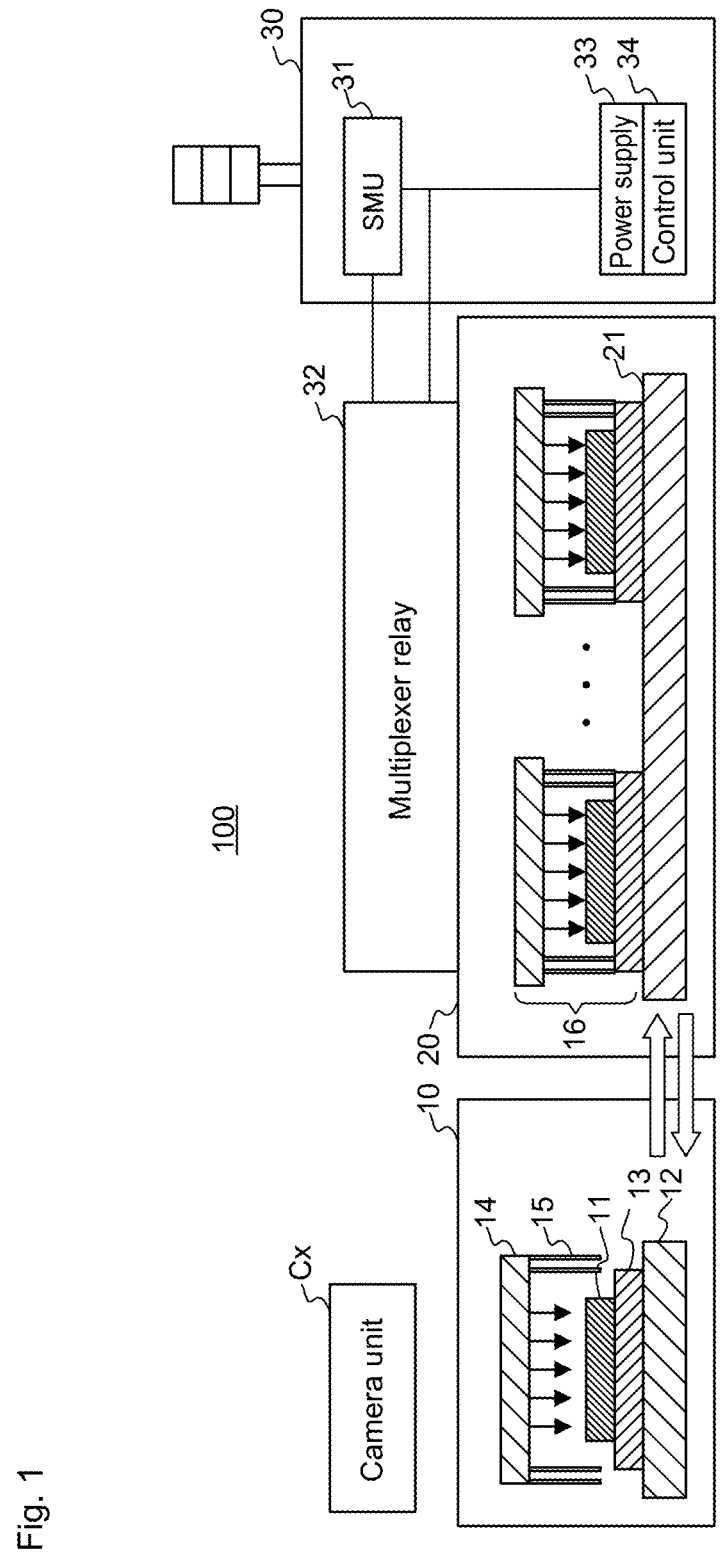
FIG. 1 is a block diagram showing a configuration of a semiconductor test equipment of the present Example.

Hereinafter, an Example of the present invention will be described with reference to drawings. In addition, the same reference numeral is fixed to a substantially same or equivalent part in the description and accompanying drawings in the following Example.

FIG. 1 is a cross-sectional view schematically showing a configuration of a semiconductor test equipment 100 of the present Example. The semiconductor test equipment 100 is configured of a wafer alignment table 10, a testing table 20 and a measuring device 30.

The semiconductor test equipment 100 is a test equipment for conducting a burn-in test under an environment of applying a voltage at high temperature (hereinafter, referred to as a high temperature voltage application test) by applying a semiconductor wafer 11 as a device to be tested, and checking characteristics thereof. The semiconductor wafer 11 is formed of a MOSFET wafer, an IGBT wafer or an RC-IGBT wafer, for example. In the high temperature voltage application test in the present Example, a temperature of the semiconductor wafer 11 is raised to a predetermined testing temperature and a testing voltage is applied thereto, and a screening test on a defect such as an oxide film defect, an interlayer film defect and a crystal defect is conducted on a gate oxide film portion thereof or an interlayer film portion thereof.

The wafer alignment table 10 has a semiconductor wafer chuck 12 and a semiconductor wafer stage 13. Moreover, a camera unit CX for recognizing a position and orientation of a probe during alignment is arranged in proximity to the wafer alignment table 10.

In the wafer alignment table 10, a probe card 14 is contacted and attached to the semiconductor wafer 11 placed on the semiconductor wafer stage 13. The probe card 14 and the semiconductor wafer 11 are held in a contacted state together with the semiconductor wafer stage 13 by a holding tool 15. Thus, a contact unit formed of the semiconductor wafer 11, the semiconductor wafer stage 13, the probe card 14 and the holding tool 15 is configured.

A conveying device (not shown) is provided between the wafer alignment table 10 and the testing table 20 to cause conveyance of the contact unit 16.

The testing table 20 has a testing stage 21 capable of arranging a plurality of the contact units 16 and placing the units 16 thereon. The testing stage 21 is configured of a temperature control stage for controlling a temperature in order to raise the temperature of the semiconductor wafer 11 to a desired testing temperature, and a testing table fixing stage for sucking and fixing the contact unit 16.

The measuring device 30 has an SMU (source measure unit) 31, a multiplexer relay 32, a power supply 33 and a PC 34. The SMU 31 is a measure unit for measuring a current and a voltage on each semiconductor chip formed on the semiconductor wafer 11, and is connected to the semiconductor wafer 11 through the multiplexer relay 32. The SMU 31 configures a characteristic measuring circuit together with the multiplexer relay 32 to measure characteristics of each semiconductor chip formed on the semiconductor wafer 11.

Moreover, the power supply 33 is connected to each semiconductor wafer 11 by turning on of the multiplexer relay 32, and the testing voltage in the high temperature voltage application test is applied thereto. More specifically, a voltage application circuit for applying the testing voltage to each semiconductor wafer 11 is configured by the power supply 33 and the multiplexer relay 32. The PC 34 causes control of operation of each unit of the measuring device 30 and recording of various data.

Figure 2:
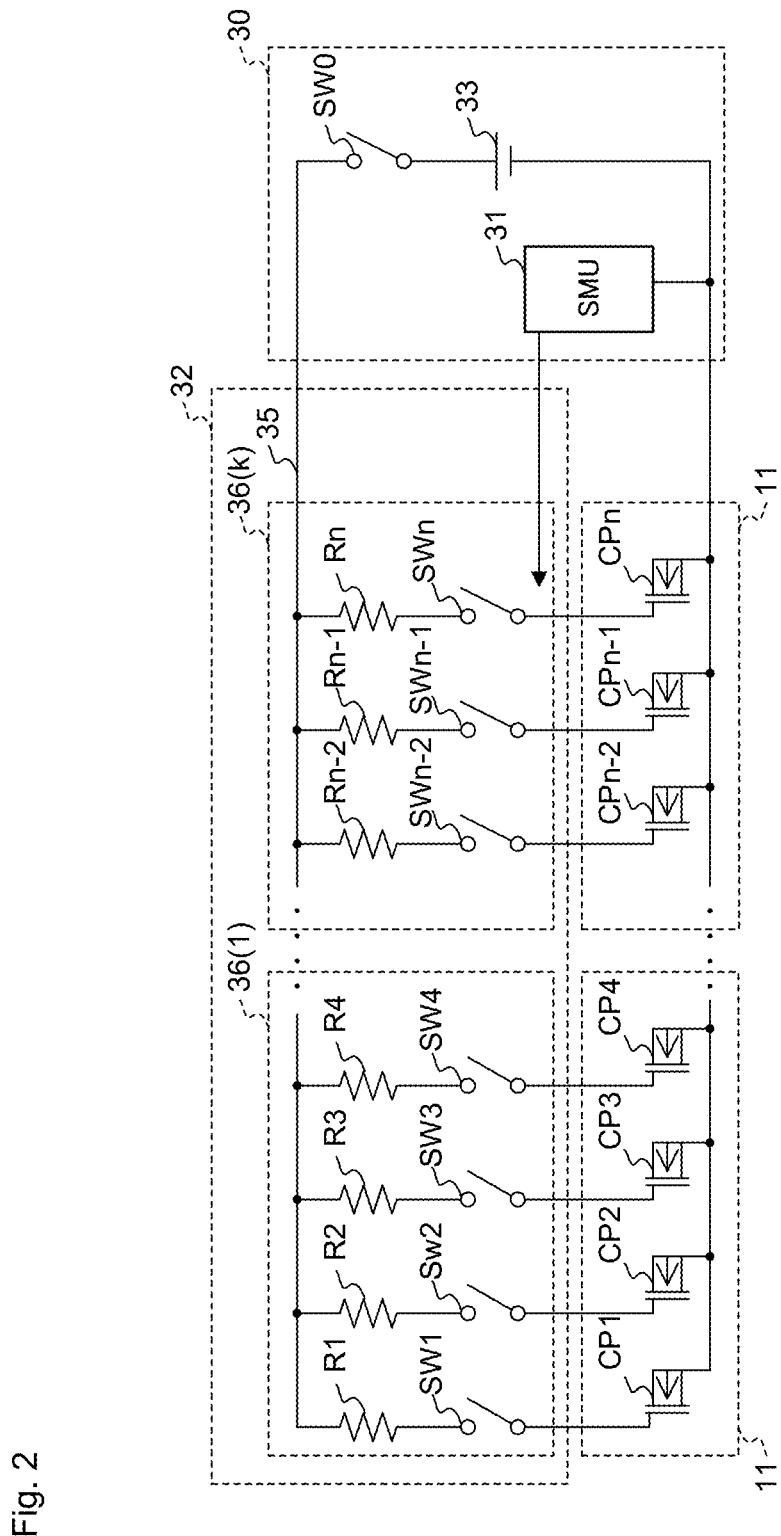
FIG. 2 is a circuit diagram showing an example of a testing circuit.

FIG. 2 is a circuit diagram showing a configuration of a testing circuit configured of an SMU 31, a multiplexer relay 32 and a power supply 33. Here, the present Example will be described by taking as an example a case where k sets of contact units 16 (k: an integer of 2 or more) each are applied as an object of the high temperature voltage application test, and n pieces of semiconductor chips CP1 to CPn (n: an integer of 2 or more) are formed on a semiconductor wafer 11 in each contact unit 16.

The multiplexer relay 32 has an application cable 35, and k sets of connection units 36(1) to 36(k). Each of the connection units 36(1) to 36(k) has a similar configuration, and therefore one of the connection units 36(1) to 36(k) is merely represented as a connection unit 36, and the configuration thereof will be described.

The application cable 35 is a connection line connecting the connection units 36(1) to 36(k) to the power supply 33.

The connection unit 36 is configured in such a manner that the connection unit 36 has n pieces of current-limiting resistances R1 to Rn, and when a semiconductor chip is judged to have imperfection by the high temperature voltage application test, an excessive current can be prevented from flowing, and simultaneously the high temperature voltage application test is continuously conducted on other semiconductor chips.

Moreover, the connection unit 36 has n sets of changeover switches SW1 to SWn connected to the current-limiting resistances R1 to Rn, respectively. A power supply switch SW0 is provided between the power supply 33 and the current-limiting resistances R1 to Rn.

When the testing voltage is applied thereto in the high temperature voltage application test, the power supply switch SW0 is turned into an on state. Then, the power supply 33 is connected to the semiconductor chips CP1 to CPn through the current-limiting resistances R1 to Rn by turning on each of the changeover switches SW1 to SWn. Thus, the plurality of the semiconductor chips CP1 to CPn of the semiconductor wafer 11 are connected in parallel, and the testing voltage is simultaneously applied to each semiconductor chip.

In addition, the changeover switches SW1 to SWn are configured so that the switches can be separately turned on or off, respectively, by control of the SMU 31. For example, when a certain semiconductor chip is judged to have imperfect characteristics as a result of checking the characteristics by the SMU 31 before the high temperature voltage application test, the SMU 31 causes control of the changeover switch corresponding to the semiconductor chip to be turned off. Thus, the high temperature voltage application test is not conducted on the semiconductor chip judged to have the imperfect characteristics.

Figure 3:
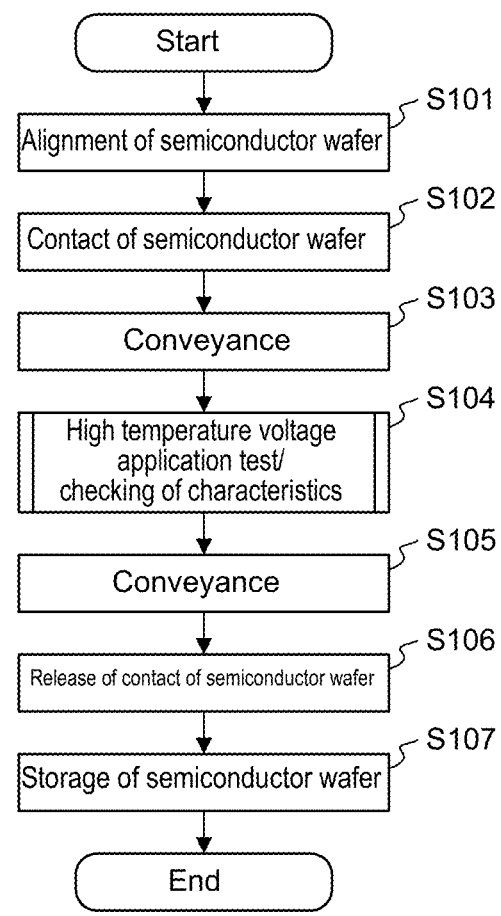
FIG. 3 is a flow chart showing a processing routine of semiconductor testing processing.

Next, processing operation of the high temperature voltage application test and checking the characteristics by the semiconductor test equipment 100 of the present Example will be described with reference to a flow chart shown in FIG. 3.

First, in a wafer alignment table 10, a semiconductor wafer 11 is loaded from a semiconductor wafer cassette (not shown) holding a plurality of semiconductor wafers, and positional adjustment (alignment) of the semiconductor wafer 11 in an X direction, a Y direction and a Z direction is performed for contacting a probe card 14 therewith (step S101).

After the alignment, the probe card 14 is contacted with the semiconductor wafer 11 (step S102).

FIGS. 4A to 4D are diagrams schematically showing a contact method for a semiconductor wafer 11 and a probe card 14 in a wafer alignment table 10.

Figure 4A:
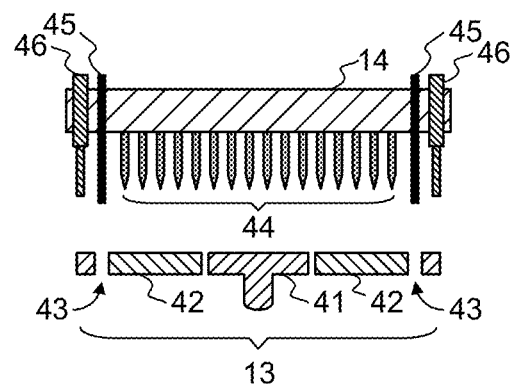
FIGS. 4A-4D are diagrams showing a method of contact of a semiconductor wafer.

As shown in FIG. 4A, a semiconductor wafer stage 13 is configured of a movable stage 41 and a fixing stage 42. The movable stage 41 is a stage for aligning the semiconductor wafer 11 in the step S101, and the fixing stage 42 is a stage for sucking and fixing the aligned semiconductor wafer 11. The fixing stage 42 is provided with a guiding hole 43 for a positioning pin for correcting misalignment with the probe card 14. The movable stage 41 is provided in a center portion of the semiconductor wafer stage 13, for example, and the fixing stage 42 is provided so as to surround the movable stage 41.

The probe card 14 has contact probes 44 each to be contacted with each of a plurality of semiconductor chips formed on the semiconductor wafer 11. The contact probes 44 each are connected to a gate pad and a source pad of each semiconductor chip, for example.

Moreover, the probe card 14 has a positioning pin 45 and a height adjusting portion 46. The height adjusting portion 46 is configured of a micrometer to adjust height for controlling an indentation load after contacting the probe card 14 with the wafer, for example.

Figure 4B:
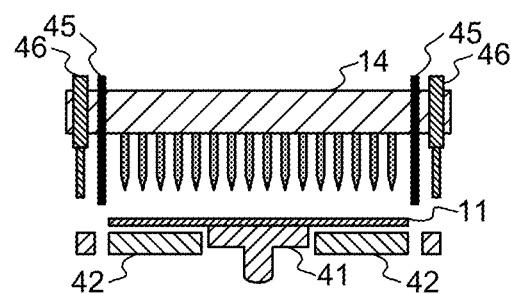
Figure 4C:
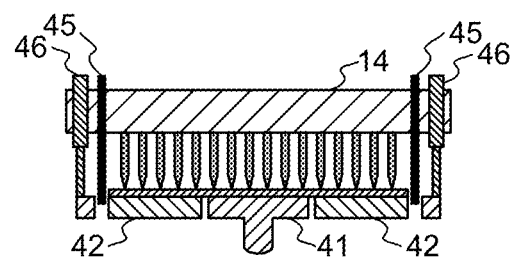
Figure 4D:
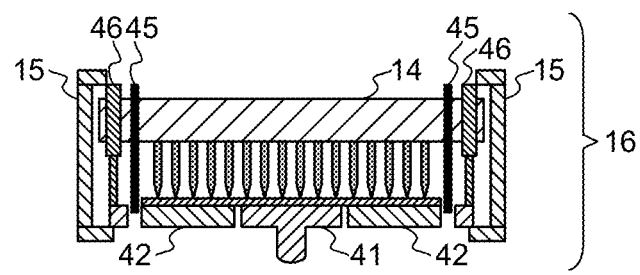

As shown in FIG. 4B, the semiconductor wafer 11 is placed on the movable stage 41, and aligned. After the alignment, as shown in FIG. 4C, the semiconductor wafer 11 is sucked and fixed onto the fixing stage 42, the probe card 14 is contacted with the semiconductor wafer 11, and the contact probes 44 each are contacted with each semiconductor chip on the semiconductor wafer 11. As shown in FIG. 4D, an assembly is fixed by a holding tool 15 in a state of contacting the probe card 14 with the semiconductor wafer 11 to configure a contact unit 16.

With reference to FIG. 3 again, the probe card 14 is contacted with the semiconductor wafer 11 in the step S102, and then a conveying mechanism provided between a wafer alignment table 10 and a testing table 20 causes conveyance of the contact unit 16 from the wafer alignment table 10 to the testing table 20 (step S103). On the above occasion, the conveyance is performed by automatically conveying the contact unit 16 in a state in which a movable stage 41 is removed.

In the testing table 20, a voltage at high temperature is applied and characteristics are checked on the contact unit 16 (step S104).

Figure 5:
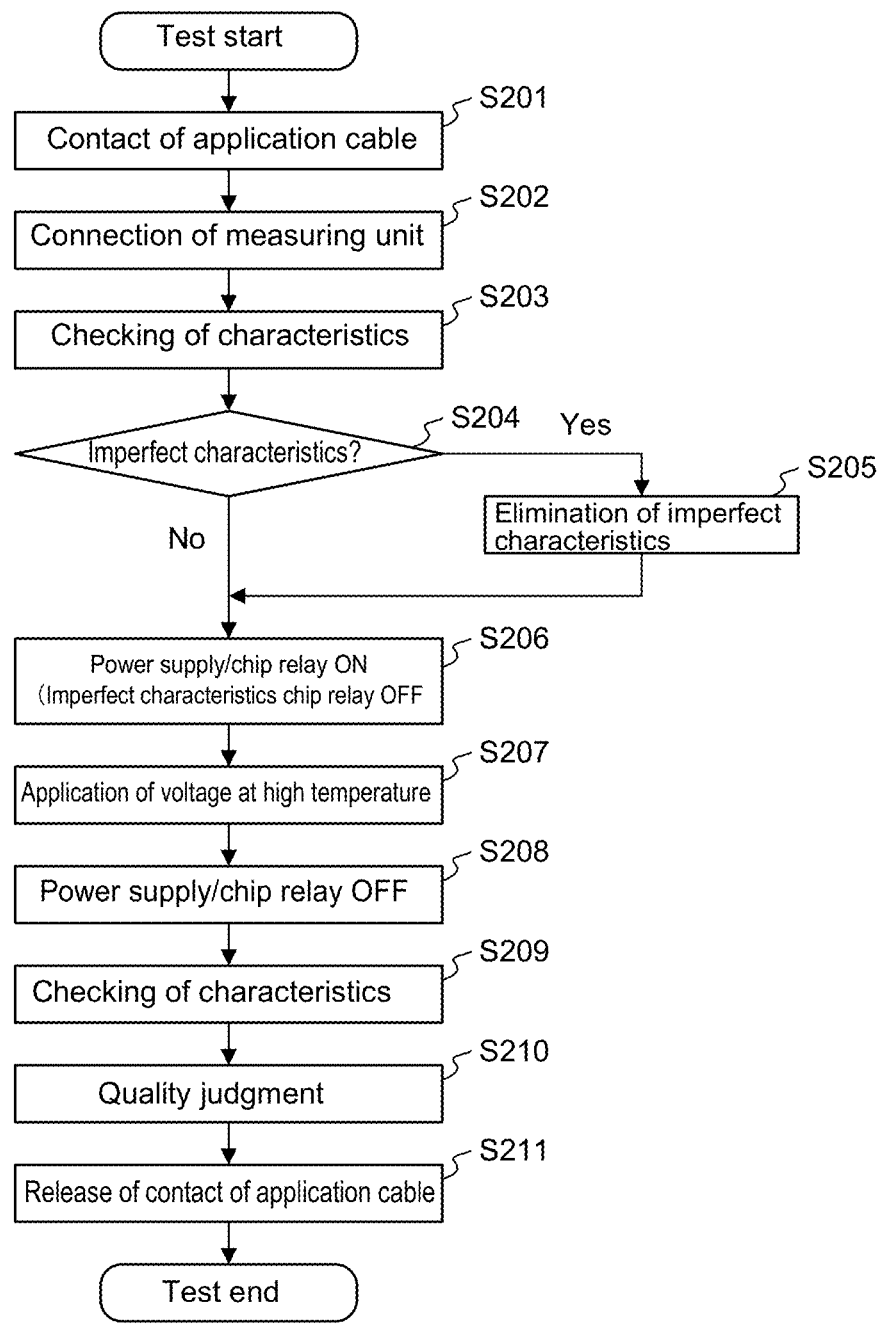
FIG. 5 is a flow chart showing a processing routine of applying a voltage at high temperature and checking processing of characteristics.

A processing routine of applying the voltage at high temperature and checking the characteristics will be described with reference to a flow chart in FIG. 5, and FIGS. 6A and 6B.

First, a measuring device 30 causes contact of an application cable 35 with a plurality of contact units 16 conveyed from a wafer alignment table 10 to a testing table 20 (step S201) to connect an SMU 31 being the measure unit thereto (step S202).

Figure 6A:
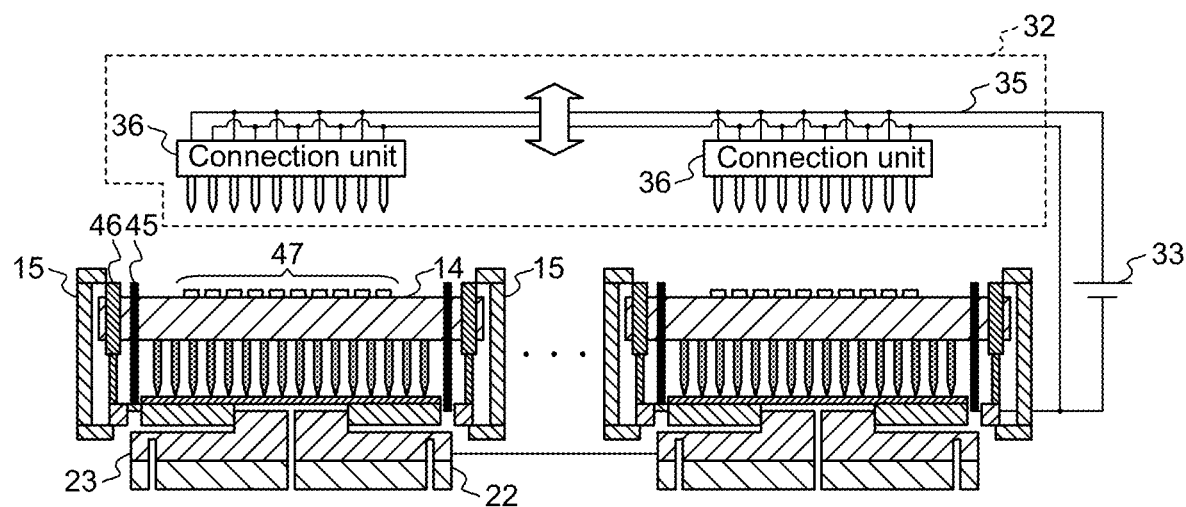
FIGS. 6A and 6B are diagrams showing contact of an application cable for applying a voltage.
Figure 6B:
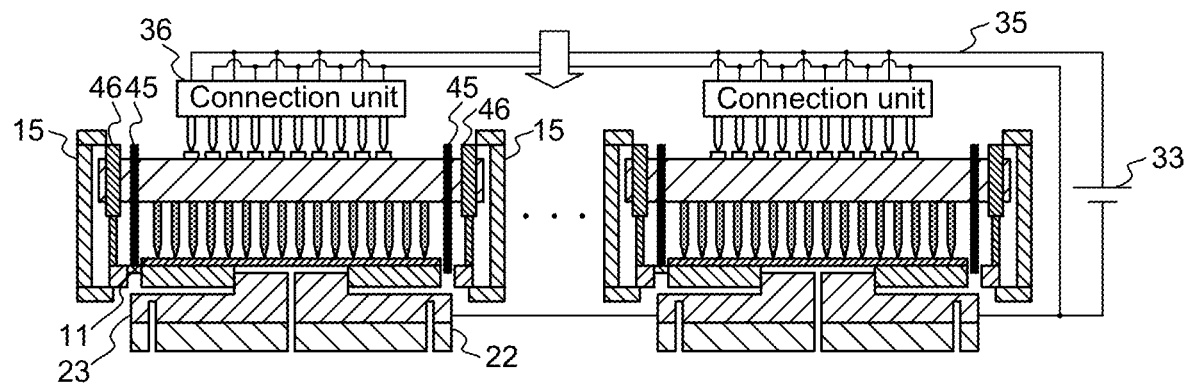

As shown in FIG. 6A, the testing table 20 has a plurality of temperature control stages 22 and a plurality of testing table fixing stages 23. The temperature control stage 22 being a lower stage has a temperature sensor, a heater, a cooling chiller and the like to cause control of temperature of the semiconductor wafer 11 in the contact unit 16. The testing table fixing stage 23 being an upper stage has a convex shape to cause sucking of a fixing stage 42 and a whole rear surface of the semiconductor wafer 11 in the contact unit 16.

The temperature control stages 22 and the testing table fixing stages 23 are configured in such a manner that a plurality (for example, k sets being the same number of connection units 36) thereof are arranged in a line, and a plurality of semiconductor wafers 11 (contact units 16) can be aligned in the testing table 20.

A lead-out wiring line 47 is led out from each of contact probes 44 and contacted with a connection unit 36 in a state in which each contact unit 16 is placed on the testing table fixing stage 23. Thus, as shown in FIG. 6B, a semiconductor chip (not shown) formed on the semiconductor wafer 11 is connected to the connection unit 36.

With reference to FIG. 5 again, a characteristic measuring circuit formed of an SMU 31 and a multiplexer relay 32 causes checking of characteristics, such as measurement of a leakage current, measurement of withstand pressure and measurement of a threshold voltage on each semiconductor chip formed on each semiconductor wafer 11 in a state before a testing voltage by a power supply 33 is applied thereto (more specifically, in a state in which the power supply switch SW0 shown in FIG. 2 is maintained in an off state) (step S203).

The SUM 31 causes judgment as to presence or absence of a chip having imperfect characteristics based on the results of checking the characteristics (step S204).

If the chip having imperfect characteristics is present (Yes in the step S204), the chip having imperfect characteristics is eliminated (step S205).

If the chip having imperfect characteristics is absent (No in the step S204), or after the chip having imperfect characteristics is eliminated, the multiplexer relay 32 causes turning on of changeover switches SW1 to SWn of each connection unit 36 (step S206). On the above occasion, in order to eliminate the chip having imperfect characteristics excluded in the step S205 from an object of a high temperature voltage application test, the changeover switches corresponding thereto are maintained in the off state.

In the testing table 20, a temperature of the semiconductor wafer 11 is raised to a predetermined testing temperature (high temperature) by temperature control of the temperature control stage 22. Then, the measuring device 30 causes turning on of the power supply switch SW0 to connect the power supply 33 to each connection unit 36, and to apply a testing voltage to each semiconductor chip formed on each semiconductor wafer 11 to conduct the high temperature voltage application test (step S207).

After completion of the high temperature voltage application test, the multiplexer relay 32 causes turning off of the changeover switches SW1 to SWn of each connection unit 36 (step S208). Thus, a state in which the testing voltage is not applied each semiconductor chip is formed.

The characteristic testing circuit formed of the SMU 31 and the multiplexer relay 32 causes checking of the characteristics, such as measurement of a leakage current, measurement of withstand pressure and measurement of a threshold voltage on each semiconductor chip (step S209).

The SMU 31 causes judgment on quality of each semiconductor chip based on the results of checking the characteristics after the high temperature voltage application test (step S210). The measuring device 30 causes collection of data showing the results of quality judgment into a PC 34. The collected data is used for an in-mark for imperfect chips in the next step, for example.

The measuring device 30 causes release of contact of an application cable 35 (step S211). Processing of applying the voltage at high temperature and checking the characteristics finishes according to the steps described above.

With reference to FIG. 3 again, the conveying mechanism provided between the wafer alignment table 10 and the testing table 20 causes conveyance of the contact units 16 one by one from the testing table 20 to the wafer alignment table 10 (step S105).

In the wafer alignment table 10, the contact between the semiconductor wafer 11 and the probe card 14 is released (step S106).

Figure 7A:
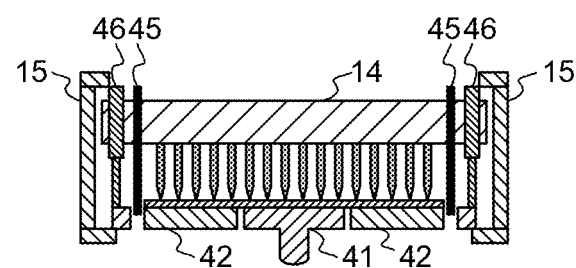
FIGS. 7A and 7B are diagrams showing an aspect of release of contact of a semiconductor wafer.
Figure 7B:
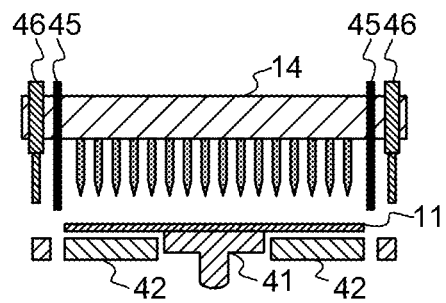

FIGS. 7A and 7B are diagrams schematically showing a method for releasing contact between a semiconductor wafer 11 and a probe card 14. First, in a wafer alignment table 10, a contact unit 16 is contacted with a movable stage 41. Then, as shown in FIG. 7A, a holding unit 15 is released from the contact unit 16, and then, as shown in FIG. 7B, a probe card 14, a positioning pin 45 and a height adjusting portion 46 are released.

After the contact between the semiconductor wafer 11 and the probe card 14 is released, the semiconductor wafer 11 is detached from the movable stage 41 and the fixing stage 42, and stored in a semiconductor cassette (not shown) (step S107).

For all the tested semiconductor wafers 11, the contact is released, and the wafers 11 are stored in the semiconductor cassette, and the test ends.

As described above, the semiconductor test equipment 100 of the present Example is configured in such a manner that the semiconductor test equipment 100 has the voltage application circuit formed of the power supply 33 and the multiplexer relay 32, the plurality of semiconductor wafers 11 in the state of contacting the probe card 14 therewith are aligned on the testing table 20, and the testing voltage can be simultaneously applied thereto through the application cable 35 and the plurality of connection units 36. Accordingly, a testing time in conducting the burn-in test by applying the voltage on the plurality of semiconductor wafers 11 can be shortened.

Moreover, the testing circuit has a simplified circuit configuration formed of the SMU 33, the multiplexer relay 32 and the power supply 33, and the high temperature voltage application test can be simultaneously conducted on the desirable number of semiconductor wafers 11 by preliminarily mounting or appropriately adding the necessary number of the connection units 36, the temperature control stages 22 and the testing table fixing stages 23. Accordingly, according to the semiconductor test equipment 100 of the present Example, a general-purpose and scalable test equipment can be realized.

In addition, the present invention is not limited to the embodiment described above. For example, in the Example described above, the present invention is described on an example in which the movable stage 41 is provided in a center portion and the fixing stage 42 is provided in a peripheral portion, but a shape of each stage is not limited thereto.

Moreover, in the Example described above, the present invention is described by taking as the example the case where the defect such as the oxide film defect, the interlayer film defect and the crystal defect is screened on the gate oxide film portion or the interlayer film portion, but all the defects are not always necessary to be screened and any one only needs to be screened.

Moreover, in the Example described above, the measurement of the leakage current, the withstand pressure and the threshold voltage is taken as the example, but a content of checking the characteristics is not limited thereto.

EXPLANATION OF NUMERALS AND CHARACTERS

100: Semiconductor test equipment
10: Wafer alignment table
11: Semiconductor wafer
12: Semiconductor wafer chuck
13: Semiconductor wafer stage
14: Probe card
15: Holding tool
16: Contact unit
20: Testing table
21: Testing stage
22: Temperature control stage
23: Testing table fixing stage
30: Measuring device
31: SMU
32: Multiplexer relay
33: Power supply
34: PC
35: Application cable
36: Connection unit
41: Movable stage
42: Fixing stage
43: Guiding hole for positioning pin
44: Contact probe
45: Positioning pin
46: Height adjusting portion
47: Lead-out wiring line
R1 to Rn: Current-limiting resistance

What is claimed is:

1. A semiconductor test equipment, comprising:
a plurality of contact units, each being configured to be held over each of semiconductor wafers, and comprising a probe card having a plurality of contact probes each corresponding to each of a plurality of semiconductor chips formed on the semiconductor wafer to contact with the semiconductor wafer, and a holding tool for holding the semiconductor wafer and the probe card corresponding thereto in a contacted state;
a testing table for aligning the plurality of contact units thereon;
a voltage application circuit having a connection wiring line and a plurality of connection units provided for parallel connections of the plurality of contact units aligned on the testing table so as to apply a testing voltage to each of the semiconductor wafers corresponding thereto held to each of the plurality of contact units; and
a characteristic measuring circuit for measuring characteristics of the plurality of semiconductor chips formed on the semiconductor wafer according to application of the testing voltage.

2. The semiconductor test equipment according to any one of claim 1, wherein, when presence of imperfect characteristics is detected in the semiconductor chip by measurement in the characteristic measuring circuit, the voltage application circuit causes stop of application of the testing voltage to the semiconductor chip in which the imperfect characteristics are detected.

3. A semiconductor test equipment, comprising:
a testing table capable of aligning a plurality of contact units each formed of a probe card having a plurality of contact probes each corresponding to each of a plurality of semiconductor chips formed on a semiconductor wafer to contact with the semiconductor wafer, and a holding tool for holding the semiconductor wafer and the probe card in a contacted state;
a voltage application circuit having a connection wiring line and a plurality of connection units provided in a manner capable of parallel connection of the plurality of contact units aligned on the testing table so as to apply a testing voltage to the semiconductor wafer held to each of the plurality of contact units; and
a characteristic measuring circuit for measuring characteristics of the plurality of semiconductor chips formed on the semiconductor wafer according to application of the testing voltage,
wherein each of the plurality of connection units is connected to the contact unit through a plurality of lead-out wiring lines from the plurality of contact probes, and has a plurality of resistances which are connected to the plurality of lead-out wiring lines for the purpose of current-limiting.

4. The semiconductor test equipment according to any one of claim 3, wherein, when presence of imperfect characteristics is detected in the semiconductor chip by measurement in the characteristic measuring circuit, the voltage application circuit causes stop of application of the testing voltage to the semiconductor chip in which the imperfect characteristics are detected.

5. A semiconductor test equipment, comprising:
a testing table capable of aligning a plurality of contact units each formed of a probe card having a plurality of contact probes each corresponding to each of a plurality of semiconductor chips formed on a semiconductor wafer to contact with the semiconductor wafer, and a holding tool for holding the semiconductor wafer and the probe card in a contacted state;
a voltage application circuit having a connection wiring line and a plurality of connection units provided in a manner capable of parallel connection of the plurality of contact units aligned on the testing table so as to apply a testing voltage to the semiconductor wafer held to each of the plurality of contact units;
a characteristic measuring circuit for measuring characteristics of the plurality of semiconductor chips formed on the semiconductor wafer according to application of the testing voltage;
a wafer alignment table for allowing the semiconductor wafer and the probe cards to contact with each other while both are aligned to be held by the holding tool to configure the contact unit; and
a conveying device for conveying the contact unit configured in the wafer alignment table to the testing table.

6. The semiconductor test equipment according to claim 5, wherein the wafer alignment table comprises:
a movable stage for aligning the semiconductor wafer and the probe card; and
a fixing stage configured to be detachable to the wafer alignment table to suck and fix the aligned semiconductor wafer.

7. The semiconductor test equipment according to any one of claim 6, wherein, when presence of imperfect characteristics is detected in the semiconductor chip by measurement in the characteristic measuring circuit, the voltage application circuit causes stop of application of the testing voltage to the semiconductor chip in which the imperfect characteristics are detected.

8. The semiconductor test equipment according to any one of claim 5, wherein, when presence of imperfect characteristics is detected in the semiconductor chip by measurement in the characteristic measuring circuit, the voltage application circuit causes stop of application of the testing voltage to the semiconductor chip in which the imperfect characteristics are detected.

* * * * *